(12) United States Patent
Choi et al.

(10) Patent No.: US 10,957,538 B2
(45) Date of Patent: Mar. 23, 2021

(54) METHOD OF FORMING AND TRANSFERRING THIN FILM USING SOI WAFER AND HEAT TREATMENT PROCESS

(71) Applicant: (INDUSTRY-UNIVERSITY COOPERATION FOUNDATION HANYANG UNIVERSITY), Seoul (KR)

(72) Inventors: Chang Hwan Choi, Seoul (KR); Yu Rim Jeon, Seoul (KR); Hoon Hee Han, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 16/979,329

(22) PCT Filed: Jul. 24, 2019

(86) PCT No.: PCT/KR2019/009146
§ 371 (c)(1),
(2) Date: Sep. 9, 2020

(87) PCT Pub. No.: WO2020/022764
PCT Pub. Date: Jan. 30, 2020

(65) Prior Publication Data
US 2021/0005457 A1 Jan. 7, 2021

(30) Foreign Application Priority Data
Jul. 27, 2018 (KR) .......................... 10-2018-0087826

(51) Int. Cl.
*H01L 21/00* (2006.01)
*H01L 21/18* (2006.01)
(Continued)

(52) U.S. Cl.
CPC ...... *H01L 21/185* (2013.01); *H01L 21/02013* (2013.01); *H01L 21/02532* (2013.01); *H01L 21/7624* (2013.01); *H01L 29/78621* (2013.01)

(58) Field of Classification Search
CPC ............ H01L 21/185; H01L 21/02013; H01L 21/02016; H01L 21/02019; H01L 21/7624; H01L 21/187
See application file for complete search history.

(56) References Cited

U.S. PATENT DOCUMENTS

| 2009/0183825 A1* | 7/2009 | Sato ..................... B32B 43/006 156/273.3 |
| 2011/0227068 A1* | 9/2011 | Akiyama .......... H01L 21/76254 257/43 |

(Continued)

FOREIGN PATENT DOCUMENTS

| JP | 2005-322745 A | 11/2005 |
| JP | 2008-300571 A | 12/2008 |

(Continued)

OTHER PUBLICATIONS

Yu-Rim Jeon, et al., "Nano-Sized Thin Wafer Transfer Under Low Temperature (<250?) for the 3D Stacking Technology", The 25th Korean Conference of Semiconductors, Feb. 5-7, 2018, p. 1.

(Continued)

*Primary Examiner* — Richard A Booth
(74) *Attorney, Agent, or Firm* — Sughrue Mion, PLLC

(57) ABSTRACT

The present invention relates to a method of forming and transferring a thin film. The method of forming and transferring a thin film according to one embodiment may include a step of bonding a carrier wafer coated with a polymer bonding material to the top of a silicon-on-insulator (SOI) wafer formed by sequentially laminating a backside silicon layer, a buried oxide layer, and a silicon layer; a step of etching the backside silicon layer using the buried oxide layer as an etching barrier, and then selectively etching the buried oxide layer; a step of separating the carrier wafer from the polymer bonding material, and bonding a target wafer including an oxide layer to the bottom of the silicon layer through direct bonding; and a step of transferring the (Continued)

silicon layer to the top of the target wafer including the oxide layer by removing the polymer bonding material.

9 Claims, 6 Drawing Sheets

(51) Int. Cl.
   *H01L 21/02* (2006.01)
   *H01L 29/786* (2006.01)
   *H01L 21/762* (2006.01)

(56) References Cited

U.S. PATENT DOCUMENTS

2017/0323973 A1* 11/2017 Clifton .............. H01L 21/02532
2018/0138395 A1* 5/2018 Akiyama .............. H01L 41/335

FOREIGN PATENT DOCUMENTS

| JP | 2010-177378 A | 8/2010 |
| KR | 10-1998-0077553 A | 11/1998 |
| KR | 10-0863446 B1 | 10/2008 |
| KR | 10-2010-0043894 A | 4/2010 |
| KR | 10-1969679 B1 | 4/2019 |

OTHER PUBLICATIONS

Notice of Allowance issued from Korean Patent Application No. 10-2018-0087826 dated Apr. 4, 2019.
Office Action issued from Korean Patent Application No. 10-2018-0087826 dated Apr. 1, 2019.
International Search Report for PCT/KR2019/009146 dated Oct. 30, 2019 (PCT/ISA/210).

* cited by examiner

【FIG. 1A】
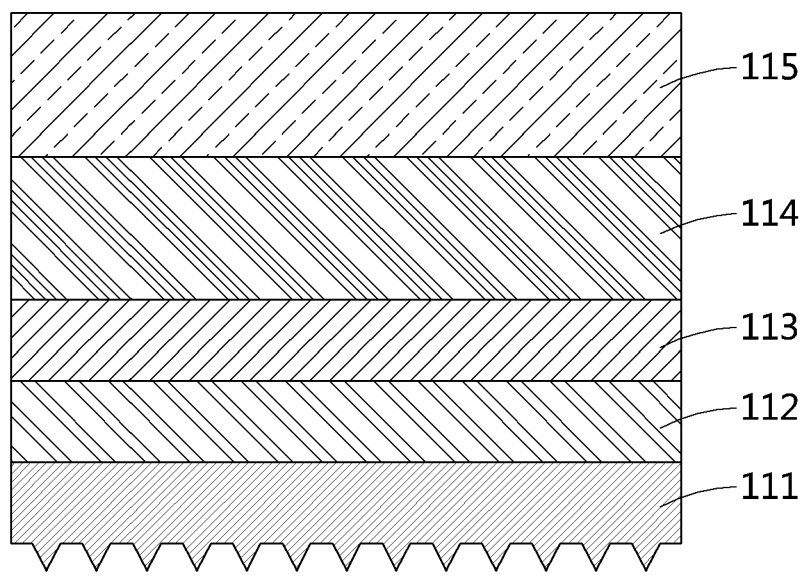

【FIG. 1B】
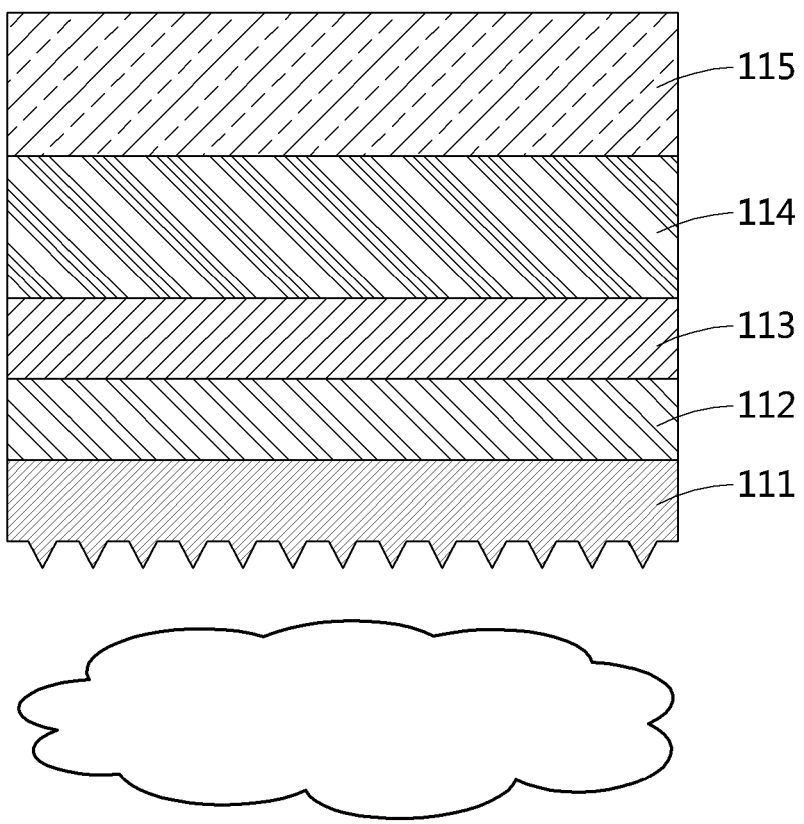

[FIG. 1C]
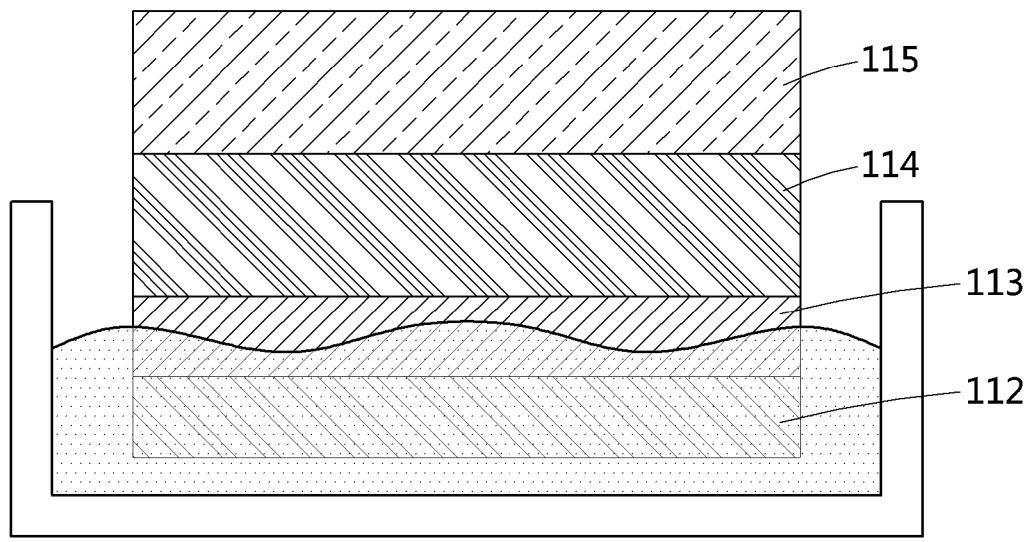

[FIG. 1D]
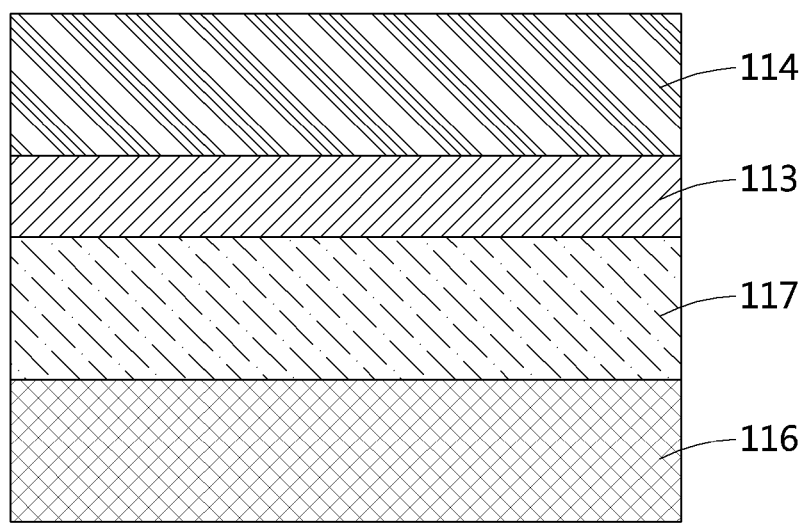

[FIG. 1E]
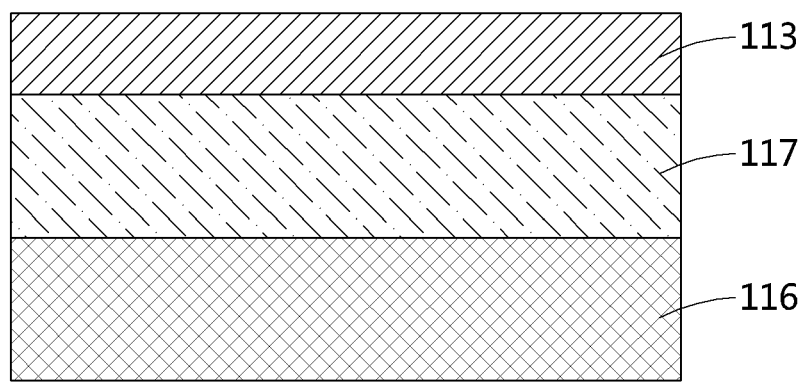

[FIG. 2]
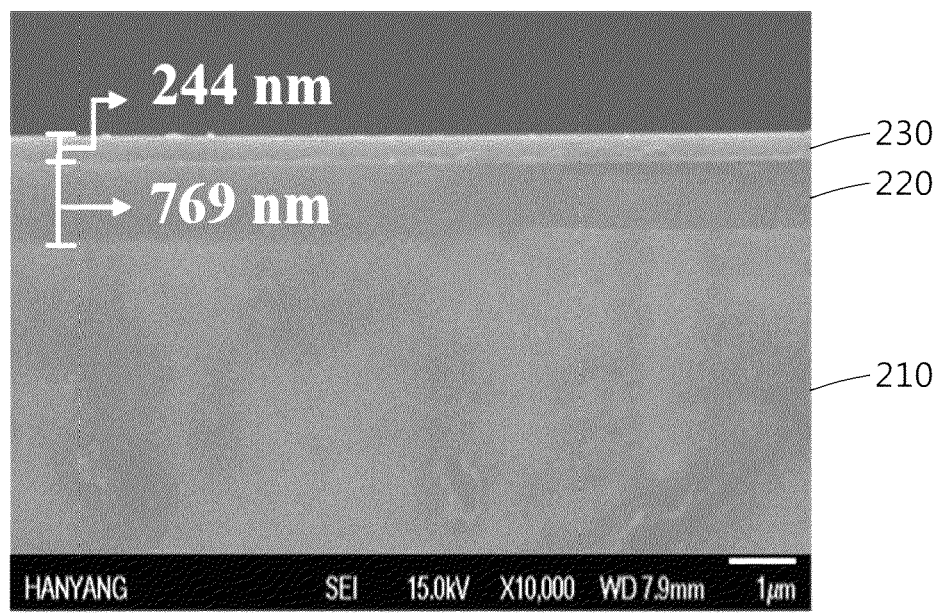

METHOD OF FORMING AND TRANSFERRING THIN FILM USING SOI WAFER AND HEAT TREATMENT PROCESS

CROSS-REFERENCE TO RELATED APPLICATION

This application is a National Stage Entry of PCT International Application No. PCT/KR2019/009146, which was filed on Jul. 24, 2019, and which claims priority to Korean Patent Application No. 10-2018-0087826, filed on Jul. 27, 2018 in the Korean Intellectual Property Office, the disclosure of which is incorporated herein by reference.

TECHNICAL FIELD

The present invention relates to a method of forming and transferring a thin film, and more particularly, to a method of forming a silicon thin film and transferring the formed silicon thin film to a target wafer.

The present invention is derived from research conducted as part of "Nano-Material Fundamental Technology Development Program (Grant number: 2016M3A7B4910426, Department: Ministry of Science and ICT (2017Y), Specialized institute of research management/lead agency: National Research Foundation of Korea, Title of research project: Implementation of 3D laminating process technology and system for synaptic/neuron devices, Contribution: 1/1, Project period: Jan. 1, 2020 to Dec. 31, 2020)/Nano-Material Technology Development Program/Original Technology Development Program of Ministry of Science and ICT and National Research Foundation of Korea".

BACKGROUND ART

In an SOI wafer, a buried oxide layer between a backside silicon layer as a substrate and a silicon layer as a device layer is formed to remove the influence of the substrate, thereby significantly improving the efficiency and properties of the device layer. Accordingly, the SOI wafer enables high integration, low power consumption, and high speed.

In particular, the semiconductor industry, which aims to develop ultra-large-scale integration devices with low power, low voltage, and high speed, is focusing on the development of SOI wafers having the aforementioned characteristics.

In addition, in the semiconductor industry, efforts are being made to develop three-dimensional laminating technologies such as wire bonding, through silicon via (TSV), and monolithic 3D to realize high integration of semiconductors.

Specifically, among the above-described three-dimensional laminating technologies, TSV technology relates to a process of electrically connecting an upper layer and a lower layer by forming vias through the upper and lower layers. Using TSV technology, power consumption can be reduced by up to 40%, and operation speed can be improved by 50% compared to wire bonding technology wherein wafers are connected using wires. Thus, due to these advantages, TSV technology is attracting attention.

However, TSV technology has technical limitations such as technical difficulties due to aspect ratio and thermal dissipation in thick vias due to the thickness of a substrate. To overcome these limitations, monolithic 3D technology wherein an element-free substrate is laminated on a substrate on which elements are formed, and then elements are formed on the element-free substrate has been proposed.

Specifically, according to a general process for monolithic 3D technology, a substrate into which hydrogen ions have been injected is turned over and laminated on a substrate on which elements have been formed, and then heat treatment is performed at 400° C.

However, in monolithic 3D technology, due to heat treatment at high temperature (400° C.), copper used as wiring lines and already formed elements can be thermally damaged. In addition, since a device layer is inverted such that the top and bottom thereof are reversed, an SOI wafer on which elements have already been formed cannot be applied to a lamination process. Accordingly, use of monolithic 3D technology is limited due to these technical limitations.

In addition, according to another process for monolithic 3D technology, wafer bonding is performed, an amorphous thin film is deposited on the upper portion of a substrate, and then laser annealing is performed for crystallization. However, this method has problems such as difficulty in realizing a large area and occurrence of local crystallization/non-crystallization or polycrystallization by laser annealing.

Therefore, to solve the above-described problems, development of a novel process capable of transferring only a thin film on which a device layer is formed through a low-temperature heat treatment process is required.

DISCLOSURE

Technical Problem

Therefore, the present invention has been made in view of the above problems, and it is one object of the present invention to provide a method of forming and transferring a thin film. According to the method of the present invention, since the buried oxide layer of an SOI wafer is used as an etching barrier, a silicon thin film may be formed and transferred without an additional process for improving uniformity and physical damage by the additional process.

It is another object of the present invention to provide a method of forming and transferring a thin film. According to the method of the present invention, since etching and heat treatment are performed at low temperatures and a thin film formed without inversion of the top and bottom of a device layer is transferred, thermal and physical damage of the formed thin film may be minimized, thereby improving the reliability of a process of forming and transferring a thin film.

It is yet another object of the present invention to provide a method of forming and transferring a thin film. According to the method of the present invention, the level of difficulty of a process of forming and transferring a thin film may be reduced, and the degree of integration of a device may be improved.

Technical Solution

In accordance with one aspect of the present invention, provided is a method of forming and transferring a thin film, the method including a step of bonding a carrier wafer coated with a polymer bonding material to a top of a silicon-on-insulator (SOI) wafer formed by sequentially laminating a backside silicon layer, a buried oxide layer, and a silicon layer; a step of etching the backside silicon layer using the buried oxide layer as an etching barrier, and then selectively etching the buried oxide layer; a step of separating the carrier wafer from the polymer bonding material, and bonding a target wafer including an oxide layer to a bottom of the silicon layer through direct bonding; and a step of transferring the silicon layer to a top of the target wafer including the oxide layer by removing the polymer bonding material.

According to one aspect of the present invention, in the step of bonding the carrier wafer, the backside silicon layer may be ground, and then the carrier wafer coated with the polymer bonding material may be bonded.

According to one aspect of the present invention, in the step of bonding the carrier wafer, the backside silicon layer may be formed to have a thickness of 200 µm through the grinding process.

According to one aspect of the present invention, in the step of bonding the carrier wafer, the carrier wafer may be bonded at a temperature of 300° C. or less under a pressure of 10 kN or less.

According to one aspect of the present invention, in the step of selectively etching the buried oxide layer, the backside silicon layer may be dry etched, and then the buried oxide layer may be selectively wet etched to form the silicon thin film.

According to one aspect of the present invention, in the step of performing bonding through direct bonding, the target wafer including the oxide layer may be bonded to the silicon layer by van der Waals force induced through direct bonding.

According to one aspect of the present invention, in the step of performing bonding through direct bonding, the carrier wafer may be separated from the polymer bonding material, and then a surface of the silicon layer and a surface of the target wafer including the oxide layer may be washed with an SC1 solution to increase bonding energy.

According to one aspect of the present invention, in the step of performing bonding through direct bonding, after washing with the SC1 solution, the target wafer including the oxide layer may be directly bonded to a bottom of the silicon layer, and heat treatment may be performed at a low temperature of 250° C. or less to bond the target wafer including the oxide layer to the silicon layer through strong covalent bonding.

According to one aspect of the present invention, in the step of transferring the silicon layer, the polymer bonding material may be selectively removed at a temperature of 150° C. or less using a remover solution.

In accordance with another aspect of the present invention, provided is a semiconductor device having a three-dimensional laminated structure fabricated using the method of forming and transferring a thin film.

Advantageous Effects

According to one embodiment, by using the buried oxide layer of an SOI wafer as an etching barrier, a silicon thin film can be formed and transferred without an additional process for improving uniformity and physical damage by the additional process.

In addition, according to one embodiment, by performing etching and heat treatment at low temperatures and transferring a thin film formed without inversion of the top and bottom of a device layer, thermal and physical damage of the formed thin film can be minimized, thereby improving the reliability of a process of forming and transferring a thin film.

In addition, according to one embodiment, the level of difficulty of a process of forming and transferring a thin film can be reduced, and the degree of integration of a device can be improved.

DESCRIPTION OF DRAWINGS

FIGS. 1A to 1E are drawings for explaining a method of forming and transferring a thin film according to one embodiment of the present invention.

FIG. 2 shows an SEM image of a thin film transfer structure formed using a method of forming and transferring a thin film according to one embodiment.

BEST MODE

Hereinafter, preferred embodiments of the present invention will be described in detail with reference to the accompanying drawings.

However, it should be understood that the present invention is not limited to the embodiments according to the concept of the present invention, but includes changes, equivalents, or alternatives falling within the spirit and scope of the present invention.

In the following description of the present invention, a detailed description of known functions and configurations incorporated herein will be omitted when it may make the subject matter of the present invention unclear.

The terms used in the specification are defined in consideration of functions used in the present invention, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or". That is, unless otherwise mentioned or clearly inferred from context, the expression "x uses a or b" means any one of natural inclusive permutations.

In the above-described specific embodiments, elements included in the invention are expressed singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present invention has been described with reference to exemplary embodiments, but it should be understood that various modifications may be made without departing from the scope of the present invention.

Therefore, the scope of the present invention should not be limited by the embodiments, but should be determined by the following claims and equivalents to the following claims.

FIGS. 1A to 1E are drawings for explaining a method of forming and transferring a thin film according to one embodiment of the present invention.

Referring to FIG. 1A to 1E, according to the method of forming and transferring a thin film according to one embodiment, a carrier wafer coated with a polymer bonding material may be bonded to the top of a silicon-on-insulator (SOI) wafer, the backside silicon layer of the SOI wafer may be etched using the buried oxide layer of the SOI wafer as an etching barrier, and then the buried oxide layer of the SOI wafer may be selectively etched to form a silicon thin film.

In addition, according to the method of forming and transferring a thin film according to one embodiment, the carrier wafer may be separated from the polymer bonding material, a target wafer including an oxide layer may be bonded to the bottom of the silicon layer through direct bonding, and the polymer bonding material may be removed. As a result, the silicon thin film may be transferred to the top of the target wafer including the oxide layer.

That is, according to the method of forming and transferring a thin film according to one embodiment, by using the buried oxide layer of the SOI wafer as an etching barrier, a silicon thin film may be formed and transferred without an additional process for improving uniformity and physical damage by the additional process.

In addition, by performing etching and heat treatment at low temperatures and transferring a thin film formed without inversion of the top and bottom of a device layer, thermal and physical damage of the formed thin film may be minimized, thereby improving the reliability of a process of forming and transferring a thin film.

Specifically, in step 110 of the method of forming and transferring a thin film according to one embodiment, a carrier wafer 115 coated with a polymer bonding material 114 may be bonded to the top of a silicon-on-insulator (SOI) wafer formed by sequentially laminating a backside silicon layer 111, a buried oxide layer 112, and a silicon layer 113.

That is, according to the method of forming and transferring a thin film according to one embodiment, by using the flexible polymer bonding material 114 and the carrier wafer 115, a thin film of the silicon layer 113 to be formed in the step described below may be formed and transferred without damage.

For example, the buried oxide layer 112 of the SOI wafer may be formed in a single-layer or multilayer structure.

In addition, as the buried oxide layer 112 of the SOI wafer, one or more insulating films of silicon oxide (SiOx) films, silicon nitride (SiN) films, silicon oxynitride (SiON) films, germanium oxide (GeOx) films, and germanium nitride (GeNx) films, which contain silicon or germanium, may be used. Alternatively, an insulating film composed of one or more metal oxides of aluminum oxide ($Al_2O_3$), tantalum oxide ($Ta_2O_5$), and hafnium oxide ($HfO_2$) or an insulating film composed of metal nitrides such as aluminum nitride (AlN) may be used. According to one aspect of the present invention, in step 110 of the method of forming and transferring a thin film according to one embodiment, the backside silicon layer 111 may be ground, and then the carrier wafer 115 coated with the polymer bonding material 114 may be bonded.

According to one aspect of the present invention, the polymer bonding material 114 may include a thermoplastic material.

That is, according to the method of forming and transferring a thin film according to one embodiment, by using a thermoplastic material as the polymer bonding material 114, after a spin coating process and a baking process, two wafers may be bonded without damage through a bonding process in which heat and pressure are applied.

Specifically, according to the method of forming and transferring a thin film according to one embodiment, wafer bonding may be performed to transfer a wafer having a nanometer-scale diameter for application of monolithic 3D. In this case, a bonding material must not be damaged in the processing of the wafer having a nanometer-scale diameter.

However, in the processing of the wafer having a nanometer-scale diameter, when a conventional bonding material wherein bonding and de-bonding thereof is performed using laser is used, a transparent glass wafer must be used as the carrier wafer. In this case, several problems may arise in the process.

More specifically, in the processing of the wafer having a nanometer-scale diameter using the conventional bonding material, since an additional process for Al deposition is required and a laser is used for de-bonding of a carrier wafer, an opaque Al layer must be selectively etched, which may be a problem.

In addition, in the processing of the wafer having a nanometer-scale diameter using the conventional bonding material, a TMAH solution must be used to remove thick backside silicon through backside wet etching. In this process, a transparent material may be damaged by the TMAH solution, which may cause de-bonding.

On the other hand, according to the method of forming and transferring a thin film according to one embodiment, a thermoplastic material used as the polymer bonding material 114 may be easily separated at room temperature using a mechanical peeling method, and a remover solution is separately prepared. Thus, the method according to one embodiment has an advantage in that the bonding material 114 may be easily removed without damage using a physical or chemical method depending on processes.

According to one aspect of the present invention, in step 110 of the method of forming and transferring a thin film according to one embodiment, the backside silicon layer 111 may be formed in a thickness of 200 μm through the grinding process.

In addition, in step 110 of the method of forming and transferring a thin film according to one embodiment, the carrier wafer 115 may be bonded by applying a pressure of 10 kN or less at a temperature of 300° C. or less for less than or equal to 10 minutes.

Preferably, in step 110 of the method of forming and transferring a thin film according to one embodiment, the carrier wafer 115 is bonded by applying a pressure of 2 kN at 200° C. for about 3 minutes.

That is, in step 110 of the method of forming and transferring a thin film according to one embodiment, the backside silicon layer 111 is ground to have a thickness of 200 μm to enable handling, and then a pressure of 2 kN is applied at 200° C. for about 3 minutes to bond the carrier wafer 115. Through this process, a bonding structure composed of the SOI wafer (111 to 113) and the carrier wafer 115 coated with the polymer bonding material 114 may be formed without voids.

Next, in step 120 of the method of forming and transferring a thin film according to one embodiment, the backside silicon layer 111 may be etched using the buried oxide layer 112 as an etching barrier.

That is, according to the method of forming and transferring a thin film according to one embodiment, by etching the backside silicon layer 111 using the buried oxide layer 112 of the SOI wafer as an etching stop layer, the precision of etching may be increased, and a thin film to be formed may be prevented from being damaged.

Next, in step 130 of the method of forming and transferring a thin film according to one embodiment, the buried oxide layer 112 may be selectively etched.

According to one aspect of the present invention, according to the method of forming and transferring a thin film according to one embodiment, in step 120, the backside silicon layer 111 may be removed by dry etching. In step 130, the buried oxide layer 112 may be selectively removed by wet etching.

For example, dry etching may be performed using one or more gases selected from the group consisting of chlorine ($Cl_2$), hydrogen bromide (HBr), hydrogen chloride (HCl), sulfur hexafluoride ($SF_6$), carbon tetrafluoride ($CF_4$), fluoroform ($CHF_3$), nitrogen trifluoride ($NF_3$), and chlorofluorocarbons (CFCs). In this case, one or more inert gases of nitrogen ($N_2$), argon (Ar), and helium (He) may be additionally used.

In addition, wet etching may be performed using one or more etching solutions of sodium peroxide disulfate ($Na_2SO_2O_8$), ammonium hydrogen difluoride ($NH_4HF_2$), nitric acid ($HNO_3$), and acetic acid ($CH_3COOH$).

That is, according to the method of forming and transferring a thin film according to one embodiment, a thin film of the silicon layer 113 may be formed to have a thickness of about 300 nm by selectively removing the backside silicon layer 111 and the buried oxide layer 112 through an etching process.

That is, when the present invention is used, since the buried oxide layer of the SOI wafer is used as an etching barrier, a silicon thin film may be formed and transferred without additional processes, such as chemical mechanical polishing (CMP) and polishing, for improving uniformity and physical damage by the additional process.

Next, in step 140 of the method of forming and transferring a thin film according to one embodiment, the carrier wafer 115 may be separated from the polymer bonding material 114, and a target wafer 116 including an oxide layer 117 may be bonded to the bottom of the silicon layer 113 through direct bonding.

According to one aspect of the present invention, in step 140 of the method of forming and transferring a thin film according to one embodiment, the target wafer 116 including the oxide layer 117 may be bonded to the silicon layer 113 by van der Waals force induced through direct bonding.

Here, van der Waals force refers to force acting between electrically neutral molecules without electrons, and in particular, refers to intermolecular attraction acting at a relatively long distance.

According to one aspect of the present invention, in step 140 of the method of forming and transferring a thin film according to one embodiment, the target wafer 116 including the oxide layer 117 may be bonded to the silicon layer 113 using any one of adhesive bonding, anodic bonding, glass frit bonding, thermocompression bonding, metal diffusion bonding (e.g., Cu—Cu), and eutectic bonding.

According to one aspect of the present invention, in step 140 of the method of forming and transferring a thin film according to one embodiment, the carrier wafer 115 may be separated from the polymer bonding material 114, and then the surface of the silicon layer 113 and the surface of the target wafer 116 including the oxide layer 117 may be washed with an SC1 solution to increase bonding energy.

For example, according to the method of forming and transferring a thin film according to one embodiment, bonding energy may be increased by washing the surface of the silicon layer 113 and the surface of the target wafer 116 including the oxide layer 117 with the SC1 solution including 0.5 to 2 units of aqueous ammonia ($NH_4OH$: 29% by mass, aqueous solution conversion) and 0.01 to 0.5 units of hydrogen peroxide ($H_2O_2$: 30% by mass, aqueous solution conversion) based on 10 units of water ($H_2O$) according to volume composition ratio.

That is, according to the method of forming and transferring a thin film according to one embodiment, by washing with the SC1 solution having the composition, foreign matter attached to the surface of the silicon layer 113 and the surface of the target wafer 116 including the oxide layer may be effectively removed, and reattachment of foreign matter may be prevented.

According to one aspect of the present invention, in step 140 of the method of forming and transferring a thin film according to one embodiment, the surfaces of the silicon layer 113 and the target wafer 116 including the oxide layer 117 may be subjected to plasma treatment to increase bonding energy. According to one aspect of the present invention, in step 140 of the method of forming and transferring a thin film according to one embodiment, after washing with the SC1 solution, the target wafer 116 including the oxide layer 117 may be directly bonded to the bottom of the silicon layer 113, and then heat treatment may be performed at a low temperature of 250° C. or less to bond the buried oxide layer 117 of the target wafer to the silicon layer 113 through strong covalent bonding.

That is, according to the method of forming and transferring a thin film according to one embodiment, since surface treatment is performed through washing using the SC1 solution and plasma treatment, and heat treatment is performed at low temperature, the buried oxide layer 117 of the target wafer may be bonded to the silicon layer 113 without damaging the polymer bonding material 114 due to heat and pressure generated during a direct bonding process.

For example, heat treatment at low temperature may be performed using a radio frequency (RF) method.

In addition, when heat treatment is performed using the radio frequency (RF) method, the radio frequency (RF) may be a super high frequency or a millimeter wave, or may correspond to a microwave region of 2 GHz to 5 GHz or a frequency band of 30 MHz to 60 MHz.

That is, a resistance heating method, which is a conventional heat treatment method, has disadvantages in that a process time (several hours) is increased and the temperature of other parts other than a wafer is also increased. However, in the case of the radio frequency (RF) method, since the temperature of only layers participating in bonding is increased, each region may be selectively heat-treated. Accordingly, compared to the resistance heating method, process time may be reduced by more than 50%. In addition, the radio frequency (RF) method may be advantageous in terms of defect control.

Next, in step 150 of the method of forming and transferring a thin film according to one embodiment, by removing the polymer bonding material 114, the silicon layer 113 may be transferred to the top of the target wafer 116 including the oxide layer 117.

According to one aspect of the present invention, in step 150 of the method of forming and transferring a thin film according to one embodiment, the polymer bonding material 114 may be selectively removed using a mechanical peeling method or a chemical method using a remover solution at a temperature of 150° C. or less.

In addition, when the polymer bonding material 114 is removed using the chemical method, the polymer bonding material 114 is exposed to nitrogen every predetermined time while immersed in the remover solution. Thereby, the removal efficiency of the polymer bonding material 114 may be improved.

Preferably, in step 150 of the method of forming and transferring a thin film according to one embodiment, the polymer bonding material is selectively removed at 80° C. using the remover solution.

In addition, using the method of forming and transferring a thin film according to one embodiment described with reference to FIGS. 1A to 1E, a semiconductor device having a three-dimensional laminated structure may be fabricated.

That is, using the method of forming and transferring a thin film according to one embodiment, a semiconductor device having a three-dimensional laminated structure, which is applied to monolithic 3D technology, through silicon via (TSV) technology, CMOS, sensors, displays, neuromorphic systems, and the like, may be fabricated.

That is, when the semiconductor device having a three-dimensional laminated structure is fabricated using the method of forming and transferring a thin film according to one embodiment, the level of process difficulty may be lowered, and the degree of integration of a device may be improved. In addition, a thin film may be formed without thermal and physical damage and the formed thin film may be transferred.

FIG. 2 shows an SEM image of a thin film transfer structure formed using a method of forming and transferring a thin film according to one embodiment.

That is, in FIG. 2, reference number 200 shows a scanning electron microscope (SEM) image of a final structure to which the silicon thin film described in step 150 shown in FIG. 1E is transferred.

Referring to FIG. 2, according to the method of forming and transferring a thin film according to one embodiment described with reference to FIGS. 1A to 1E, the silicon thin film 230 having a thickness of 244 nm may be transferred to the top of the target wafer 210 including the oxide layer 220 having a thickness of 769 nm without thermal and physical damage.

According to one aspect of the present invention, in the SOI wafer formed by sequentially laminating the backside silicon layer, the buried oxide layer, and the silicon layer, the backside silicon layer may be removed through etching using the buried oxide layer of the SOI wafer as an etching barrier, and then the buried oxide layer of the SOI wafer may be selectively etched to form the silicon layer having a thickness of 244 nm. Here, the silicon layer having a thickness of 244 nm of the SOI wafer may be the silicon thin film 230.

That is, when the present invention is used, since the buried oxide layer of the SOI wafer is used as an etching barrier, a silicon thin film may be formed and transferred without an additional process for improving uniformity and physical damage by the additional process.

In addition, by performing etching and heat treatment at low temperatures and transferring a thin film formed without inversion of the top and bottom of a device layer, thermal and physical damage of the formed thin film may be minimized, thereby improving the reliability of a process of forming and transferring a thin film. In addition, the level of process difficulty may be lowered and the degree of integration of a device may be improved.

Although the present invention has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

The invention claimed is:

1. A method of forming and transferring a thin film, comprising:
    a step of bonding a carrier wafer coated with a polymer bonding material to a top of a silicon-on-insulator (SOI) wafer formed by sequentially laminating a backside silicon layer, a buried oxide layer, and a silicon layer;
    a step of etching the backside silicon layer using the buried oxide layer as an etching barrier, and then selectively etching the buried oxide layer;
    a step of separating the carrier wafer from the polymer bonding material, and bonding a target wafer comprising an oxide layer to a bottom of the silicon layer through direct bonding; and
    a step of transferring the silicon layer to a top of the target wafer comprising the oxide layer by removing the polymer bonding material.

2. The method according to claim 1, wherein, in the step of bonding the carrier wafer, the backside silicon layer is ground, and then the carrier wafer coated with the polymer bonding material is bonded.

3. The method according to claim 2, wherein, in the step of bonding the carrier wafer, the backside silicon layer is formed to have a thickness of 200 μm through the grinding process.

4. The method according to claim 1, wherein, in the step of bonding the carrier wafer, the carrier wafer is bonded at a temperature of 300° C. or less under a pressure of 10 kN or less.

5. The method according to claim 1, wherein, in the step of selectively etching the buried oxide layer, the backside silicon layer is dry etched, and then the buried oxide layer is selectively wet etched to form a silicon thin film.

6. The method according to claim 1, wherein, in the step of performing bonding through direct bonding, the target wafer comprising the oxide layer is bonded to the silicon layer by van der Waals force induced through direct bonding.

7. The method according to claim 1, wherein, in the step of performing bonding through direct bonding, the carrier wafer is separated from the polymer bonding material, and then a surface of the silicon layer and a surface of the target wafer comprising the oxide layer are washed with an SC1 solution to increase bonding energy.

8. The method according to claim 7, wherein, in the step of performing bonding through direct bonding, after washing with the SC1 solution, the target wafer comprising the oxide layer is directly bonded to a bottom of the silicon layer, and heat treatment is performed at a low temperature of 250° C. or less to bond the target wafer comprising the oxide layer to the silicon layer through strong covalent bonding.

9. The method according to claim 1, wherein, in the step of transferring the silicon layer, the polymer bonding material is selectively removed at a temperature of 150° C. or less using a remover solution.

* * * * *